(12) United States Patent
Kim et al.

(10) Patent No.: US 7,737,443 B2
(45) Date of Patent: Jun. 15, 2010

(54) LIGHT EMITTING DEVICE AND METHOD OF MANUFACTURING THE SAME

(75) Inventors: Hak Su Kim, Seoul (KR); Hyoung Yun Oh, Seoul (KR); Yoon Heung Tak, Gumi (KR)

(73) Assignee: LG Display Co., Ltd., Seoul (KR)

( * ) Notice: Subject to any disclaimer, the term of this patent is extended or adjusted under 35 U.S.C. 154(b) by 202 days.

(21) Appl. No.: 11/755,462

(22) Filed: May 30, 2007

(65) Prior Publication Data

US 2007/0278473 A1    Dec. 6, 2007

(30) Foreign Application Priority Data

Jun. 2, 2006    (KR) .................. 10-2006-0049968

(51) Int. Cl.
*H01L 29/04* (2006.01)
*H01L 27/15* (2006.01)
(52) U.S. Cl. .......................... 257/59; 257/72
(58) Field of Classification Search .............. 257/72, 257/59
See application file for complete search history.

(56) References Cited

U.S. PATENT DOCUMENTS

| | | | |
|---|---|---|---|
| 7,485,893 B2* | 2/2009 | Lee | 257/40 |
| 2005/0012105 A1* | 1/2005 | Yamazaki et al. | 257/79 |
| 2005/0077818 A1* | 4/2005 | Hieda et al. | 313/504 |
| 2005/0259056 A1* | 11/2005 | Hanaoka et al. | 345/87 |
| 2007/0030218 A1* | 2/2007 | Ahn | 345/76 |

* cited by examiner

*Primary Examiner*—Kenneth A Parker
*Assistant Examiner*—Joseph Nguyen
(74) *Attorney, Agent, or Firm*—Morgan Lewis & Bockius LLP

(57) ABSTRACT

A light emitting device comprises an anode electrode layer disposed in a first direction, a cathode electrode layer disposed in a second direction different from the first direction, an emitting area with a pixel forming on an area crossed by the anode electrode layer and the cathode electrode layer and a sub-electrode layer disposed outside of the emitting area and electrically connected with at least two the anode electrode layers.

18 Claims, 12 Drawing Sheets

LIGHT EMITTING DEVICE AND METHOD OF MANUFACTURING THE SAME

CROSS-REFERENCE TO A RELATED APPLICATION

This application claims priority from Korean Patent Application No. 10-2006-0049968 filed on Jun. 2, 2006, the contents of which are incorporated herein by reference in its entirety.

BACKGROUND

1. Field

The present invention is directed to a light emitting device having a simple structure, and a method of manufacturing the same.

2. Background

A light emitting device generates a light having a certain wavelength when certain voltage and current are applied thereto. Especially, an organic electroluminescent device is self light-emitting device.

FIGS. 1A and 1B are plane views illustrating a light emitting device in the art.

In FIGS. 1A and 1B, the light emitting device comprises anode electrode layers 100, cathode electrode layers 102, sub-pixels 104, walls 108, anode lines 110, cathode lines 112 (112a and 112b), and a driving circuit 114.

The anode electrode layers 100 are disposed in a first direction. The cathode electrode layers 102 are disposed in a second direction different from the first direction.

The sub-pixels 104 are formed on emitting area 120 crossed by the anode electrode layers 100 and the cathode electrode layers 120, and comprise red sub-pixels emitting as red color, green sub-pixels emitting as green color, and blue sub-pixels emitting as blue color. As shown in FIGS. 1A and 1B, a pixel 106 is formed with red sub-pixel, green sub-pixel, and blue sub-pixel disposed in sequence so that the pixel 106 can be generated a light having various colors by combining red, green and blue lights.

The walls 108 are disposed between the cathode electrode layers 102, are made of an insulation material, and electrically divide the cathode electrode layers 102.

The anode lines 110 are connected to the anode electrode layers 100. The cathode lines 112 (112a and 112b) are connected to the cathode electrode layers 102.

The cathode lines 112 may be connected to one end of the cathode electrode layers 102 as shown in FIG. 1A. Also, one part of the cathode lines 112a may be connected to one end of the cathode electrode layers 102, and the other part of the cathode lines 102b may be connected to the other end of the cathode electrode layers 102, as shown in FIG. 1B.

In the driving circuit 114, a scan driver 118a connected to an end of the cathode lines 112 and a data driver 118b connected to an end of the anode lines 110 may be separately construed, as shown in FIG. 1A. Or, the driving circuit 114 may be construed as a driver 116 connected to each end of the lines 110, 112a and 112b, as shown in FIG. 1B.

The driving circuit 114 drives the sub-pixels 104. A detailed explanation thereon will follow in reference to FIG. 2.

FIG. 2 is a circuit view of illustrating the driving process of the light emitting device of FIG. 1B. Here, data lines D1 to D6 correspond to the anode electrode layers 100 and the anode lines 110, and scan lines S1 to S4 correspond to the cathode electrode layers 102 and the cathode lines 112a and 112b.

In FIG. 2, the driver 116 comprises a controller 200 and a data driver 202.

The controller 200 receives a display data from an outer apparatus (not shown), and controls connection of the scan lines S1 to S4 and the data driver 202 by using the received display data.

The data driver 202 provides data currents corresponding to a first display data and outputted from current sources CS1 to CS6, to the data lines D1 to D6, under control of the controller 200. In this case, a first scan line S1 among the scan lines S1 to S4 is connected to a ground, and the other scan lines S2 to S4 are connected to a non-emitting source having a same voltage (V1) as the driving voltage (Vc) of the light emitting device. Therefore, the data currents flow to the ground through the data lines D1 to D6, the sub-pixels E11 to E61 corresponding to the first scan line S1, and the first scan line S1. As a result, the sub-pixels E11 to E61 emit a light.

Next, the data driver 202 provides data currents corresponding to a second display data inputted to the controller 200 after the first display data, to the data lines D1 to D6, under control of the controller 200. In this case, the second scan line S2 is connected to the ground, and the other scan lines S1, S3 and S4 are connected to the non-emitting source. Thus, only the sub-pixels E12 to E62 corresponding to the second scan line S2 emit a light.

Through a similar process to the above, the sub-pixels E13 to E63 corresponding to the third scan line S3 and the sub-pixels E14 to E64 corresponding to the fourth scan lines S4 emit a light. And, the sub-pixels E11 to E64 repeatedly emit as a unit of the scan lines S1 to S4.

In short, the light emitting device in the art needs to have current sources as many as the data lines D1 to D6 for driving each of the sub-pixels E11 to E64. But, in case of the light emitting device that needs one color or several colors of light only, various colors of light emission is not needed, differently from a case of embodying an image. Thus, in the case, the light emitting device having a complicated structure is inefficient, and the size had to be increased to include many current sources.

The above references are incorporated herein by reference where required for appropriate teachings of additional or alternative details, features and/or technical background.

BRIEF DESCRIPTION OF THE DRAWINGS

Preferable embodiments of the present invention will be described in detail with reference to the following drawings in which same reference numerals refer to same elements wherein.

DETAILED DESCRIPTION

The object of the present invention is to provide a light emitting device whose structure is simplified and whose size is decreased, and a method of manufacturing the same.

Further scope of applicability of the present intention will become apparent from the detailed description given hereinafter. However, it should be understood that the detailed description, and specific examples indicating preferred embodiments of the invention, are given by way of illustration only since various changes and modifications within the spirit and scope of the invention will become apparent to those skilled in the art from the detailed description.

In the following drawings, same reference numbers will be used to refer to same or similar parts through all the embodiments. Also, detailed descriptions for identical parts are not repeated.

Figure 3:
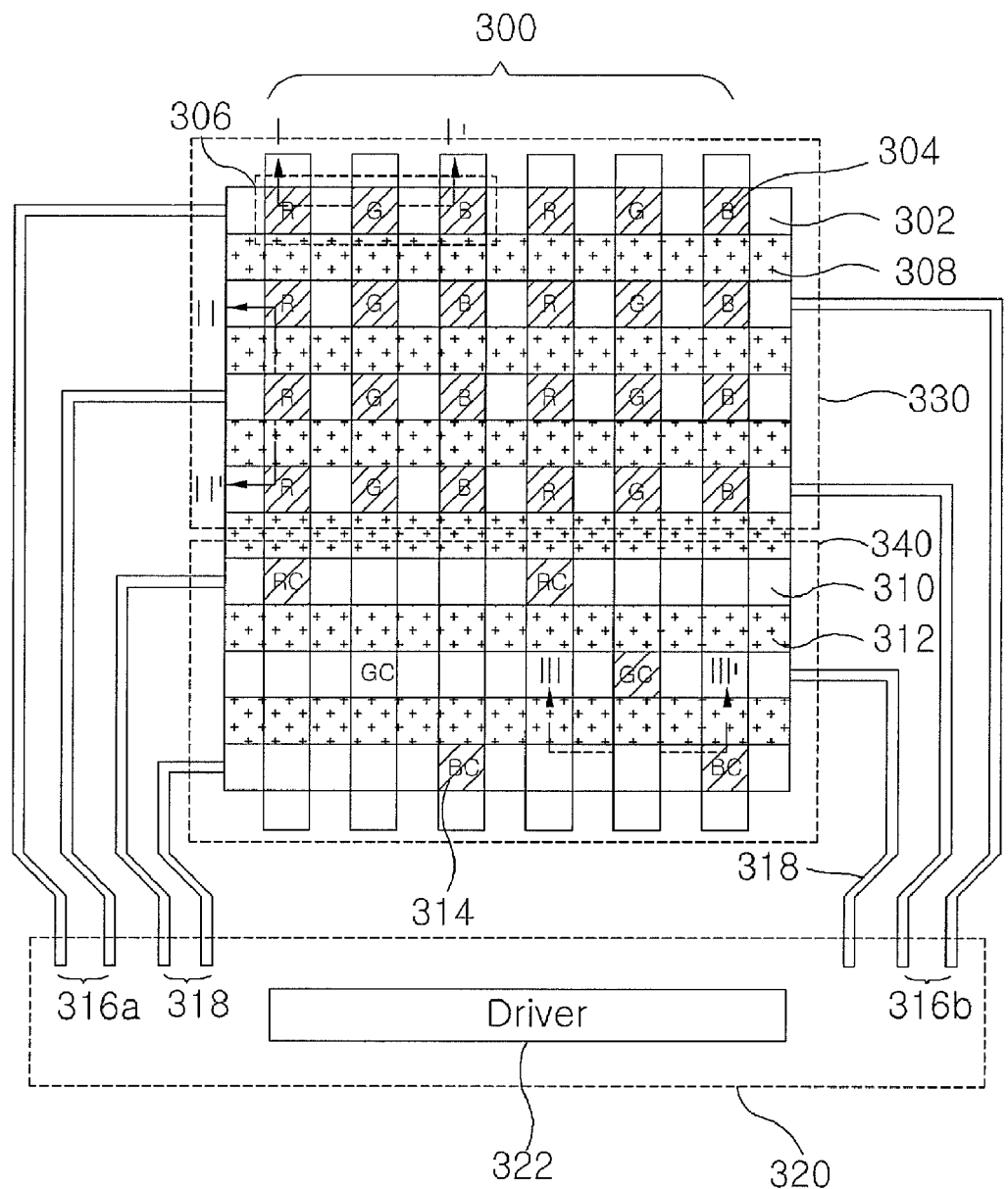
FIG. 3 is a plane view of the light emitting device according to one embodiment of the present invention.

FIG. 3 is a plane view of the light emitting device according to one embodiment of the present invention.

In FIG. 3, the light emitting device includes anode electrode layers 300, cathode electrode layers 302, sub-pixels 304, first walls 308, sub-electrode layers 310, second walls 312, contact parts 314, cathode lines 316a and 316b, sub-electrode lines 318 and a driving circuit 320.

The light emitting device according to one embodiment of the present invention may be applied to an organic electroluminescent device, a plasma display panel, and a liquid crystal display. Hereinafter, the organic electroluminescent device will be described as an example of the light emitting device for the convenience of description.

The anode electrode layers 300 are disposed in a first direction, and made of a transparent material like indium tin oxide (ITO), etc.

The cathode electrode layers 302 are disposed in a second direction different from the first direction, and made of a metal like aluminum (Al), etc.

The sub-pixels 304 are formed on an emitting area 330 crossed by the anode electrode layers 300 and the cathode electrode layers 302, and include a red sub-pixel emitting as red color, a green sub-pixel emitting as green color, and a blue sub-pixel emitting as blue color.

In this case, a pixel 306 is formed with red sub-pixel, green sub-pixel, and blue sub-pixel in sequence, as shown in FIG. 3, and so the pixel 306 can emit a light having various colors by combining red, green and blue lights.

Also, each sub-pixel 304 includes anode electrode layer 300, organic layer, and cathode electrode layer 302 formed on a substrate in sequence, as described below.

According to another embodiment, the sub-pixels 304 may include red sub-pixels, green sub-pixels, blue sub-pixels, and white sub-pixels. In this case, the pixel is formed with red, green, blue and white sub-pixels.

The first walls 308 are disposed between the cathode electrode layers 302, are made of an insulation material, and electrically divide the cathode electrode layers 302.

The sub-electrode layers 310 are disposed in the second direction, preferably made of the same material as the cathode electrode layers 302.

Also, the width of the sub-electrode layers 310 may be different from that of the cathode electrode layers 302. Preferably, the width of the sub-electrode layers 310 is substantially same as, or wider than, that of the cathode electrode layers 302.

If the width of the sub-electrode layers 310 is wider than that of the cathode electrode layers 302, resistance of the sub-electrode layers 310 may decrease. Thus, it can be decreased power consumption when data current is applied to the sub-pixels 304.

The second walls 312 are disposed between the sub-electrode layers 310 are made of same material as the first walls 308, and electrically divide the sub-electrode layers 310.

Also, the widths of the first walls 308 and the second walls 312 may be different from each other. Preferably, the width of the second walls 312 is wider than that of the first walls 308.

The contact parts 314 are formed on a part of non-emitting areas 340 crossed by the anode electrode layers 300 and the sub-electrode layers 310. For example, a first contact part (RC) among the contact parts 314 is formed on a part of a first non-emitting area crossed by the anode electrode layers 300 and a first sub-electrode layer of the sub-electrode layers 310, as shown in FIG. 3.

Also, the contact parts 314 include the anode electrode layer 300, and the sub-electrode layer 310 on the substrate in sequence, as detailed below. Only, the contact parts 314 are a kind of hole from which an insulating layer is removed, and do not emit a light because they do not include organic layer differently from the sub-pixels 304, and function as electric connecting channel.

The cathode lines 316a and 316b are conductor, and are connected to the cathode electrode layers 302. The cathode lines 316a and 316b may be arranged in both directions, as shown in FIG. 3.

The sub-electrode lines 318 are conductor, and are connected to the sub-electrode layers 310. The sub-electrode lines 318 may be arranged in both directions, as shown in FIG. 3.

The driving circuit 320 is connected to an end of lines 316a, 316b and 318 as shown in FIG. 3, and includes a driver 322.

The driver 322 drives the sub-pixels 304 and the contact parts 314, which will be described in detail in reference to the drawings below.

Figure 4A:
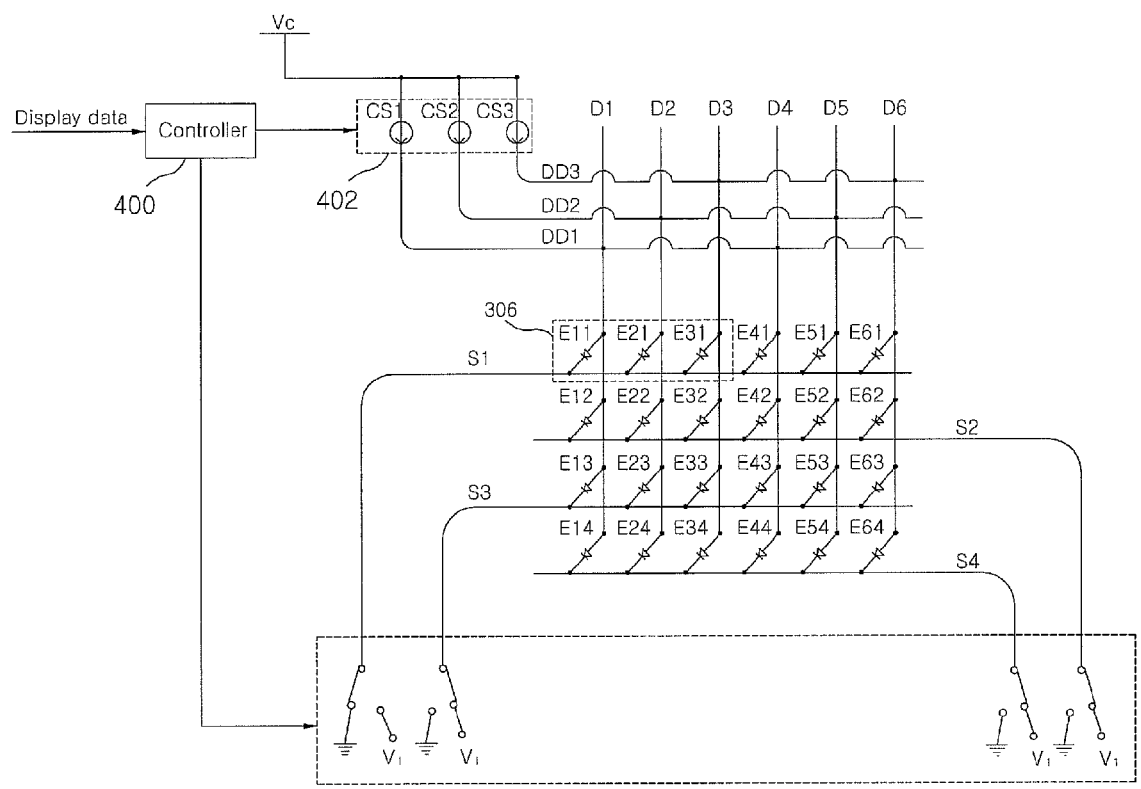
FIG. 4A is a circuit view illustrating the driving process according to one embodiment of the light emitting device of FIG. 3.

FIG. 4A is a circuit view illustrating the driving process according to one embodiment of the light emitting device of FIG. 3. Date lines D1 to D6 correspond to the anode electrode layers 300, and scan lines S1 to S4 correspond to the cathode electrode layers 302 and cathode lines 316a and 316b. Also, sub-electrode lines DD1 to DD3 correspond to the contact parts 314 and the sub-electrode lines 318.

In FIG. 4A, the driver 322 includes a controller 400 and a data driver 402.

The controller 400 receives a display data from an outer apparatus (not shown), and controls connection of the scan lines S1 to S4, and the data driver 402, by using the received display data.

The data driver 402 applies data currents corresponding to a first display data and outputted from current sources CS1 to CS3, to the data lines D1 to D6, through the sub-electrode lines DD1 to DD3, under control of the controller 400. In this case, a first scan line S1 among the scan lines S1 to S4 is connected to an emitting source, preferably the ground, and the other scan lines S2 to S4 are connected to a non-emitting source having a same voltage (V1) as the driving voltage (Vc) of the light emitting device. Thus, the data currents are sent to the ground through the sub-electrode lines DD1 to DD3, the data lines D1 to D6, and the sub-pixels E11 to E61 corresponding to the first scan line S1. As a result, the sub-pixels E11 to E61 can emit a light.

Then, the data driver 402 applies data currents corresponding to a second display data inputted to the controller 400 after the first display data, to the data lines D1 to D6, through the sub-electrode lines DD1 to DD3, under control of the controller 400. In this case, the second scan line S2 is connected to the ground, and the other scan lines S1, S3 and S4 are connected to the non-emitting source. Thus, the sub-pixels E12 to E62 corresponding to the second scan lines S2 can emit a light.

Through a similar process to the above, the sub-pixels E13 to E63 corresponding to the third scan line S3 and the sub-pixels E14 to E64 corresponding to the fourth scan lines S4 emit a light. Then, the sub-pixels E11 to E64 repeatedly emit a light as a unit of the scan lines S1 to S4.

Figure 1A:
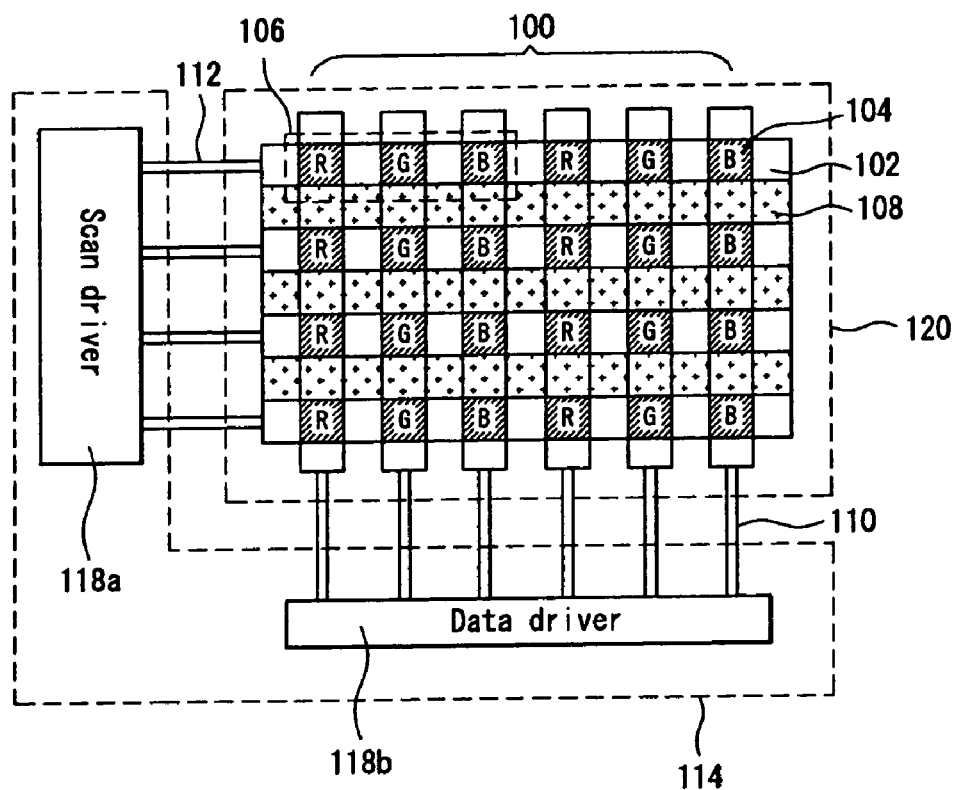
FIGS. 1A and 1B are plane views illustrating a light emitting device in the art.
Figure 1B:
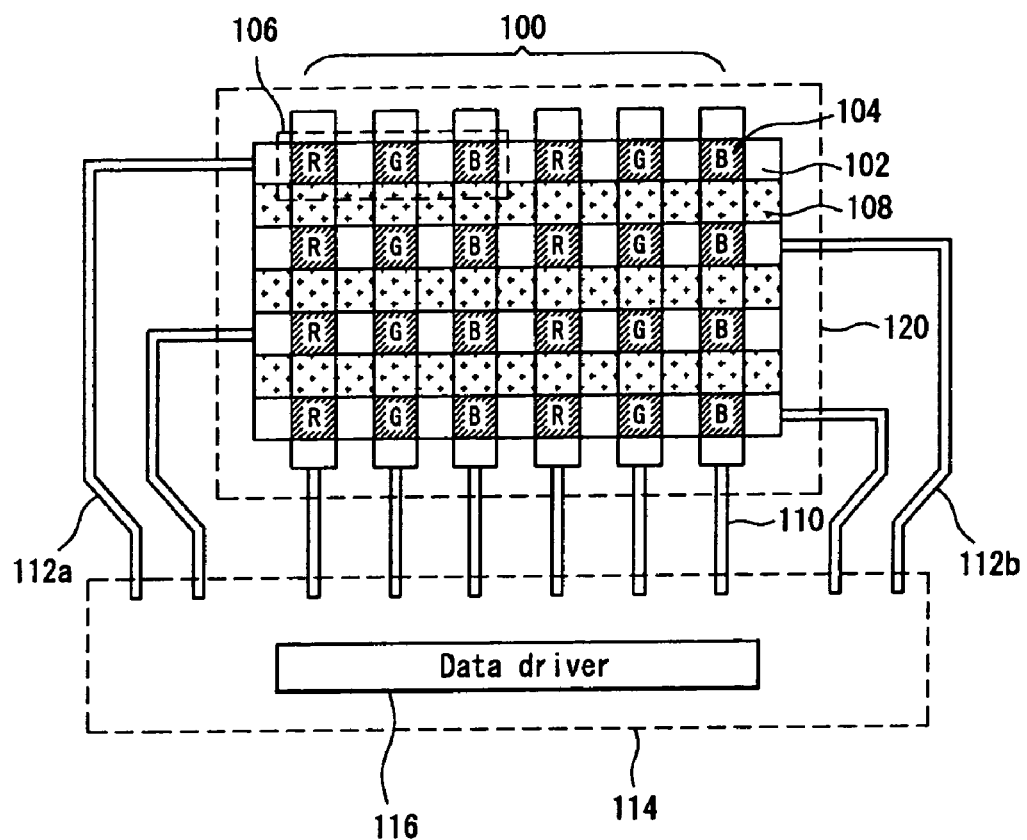
Figure 2:
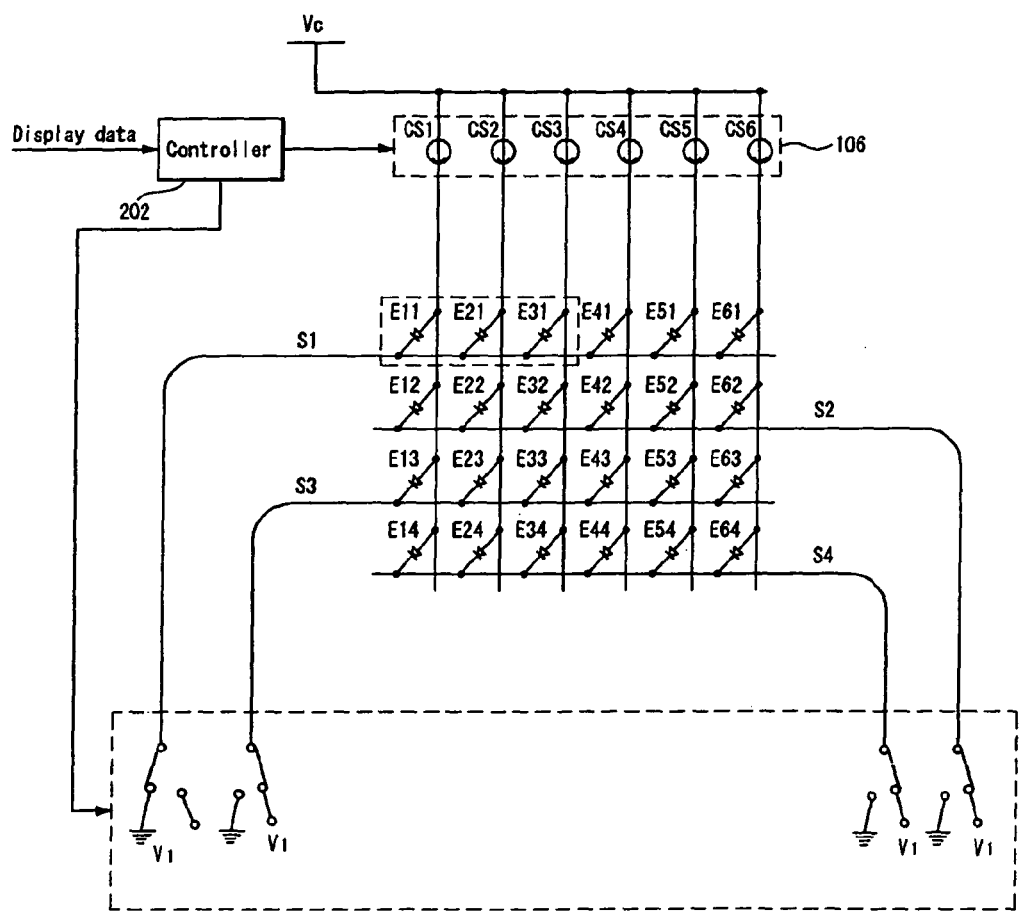
FIG. 2 is a circuit view illustrating the driving process of the light emitting device of FIG. 1B.

In short, in the light emitting device of the present invention, the first sub-electrode line DD1 is connected to the data lines D1 and D4 corresponding to the red sub-pixels E11 and E41, the second sub-electrode line DD2 is connected to the data lines D2 and D5 corresponding to the green sub-pixels E21 and E51, and the third sub-electrode line DD3 is connected to the data lines D3 and D6 corresponding to the blue sub-pixels E31 and E61. That is, when the pixel is formed with the red, green and blue sub-pixels, the data driver 402 of the present invention need only three current sources CS1 to CS3 driving each of the red, green and blue sub-pixels, different from the data driver 202 (in FIG. 2) in the art requiring current sources as many as the number of the date lines.

Thus, in the light emitting device of the present invention, the constitution can be simplified, and the cost and size can be reduced. The light emitting device of the present invention is suitable for an apparatus requiring emission of certain color. For example, the light emitting device can be used as an illuminating apparatus, a backlight apparatus, a neon sign, etc.

In the light emitting device according to another embodiment of the present invention, when the pixel is formed with red, green, blue and white sub-pixels, the data driver 402 includes four current sources.

Figure 4B:
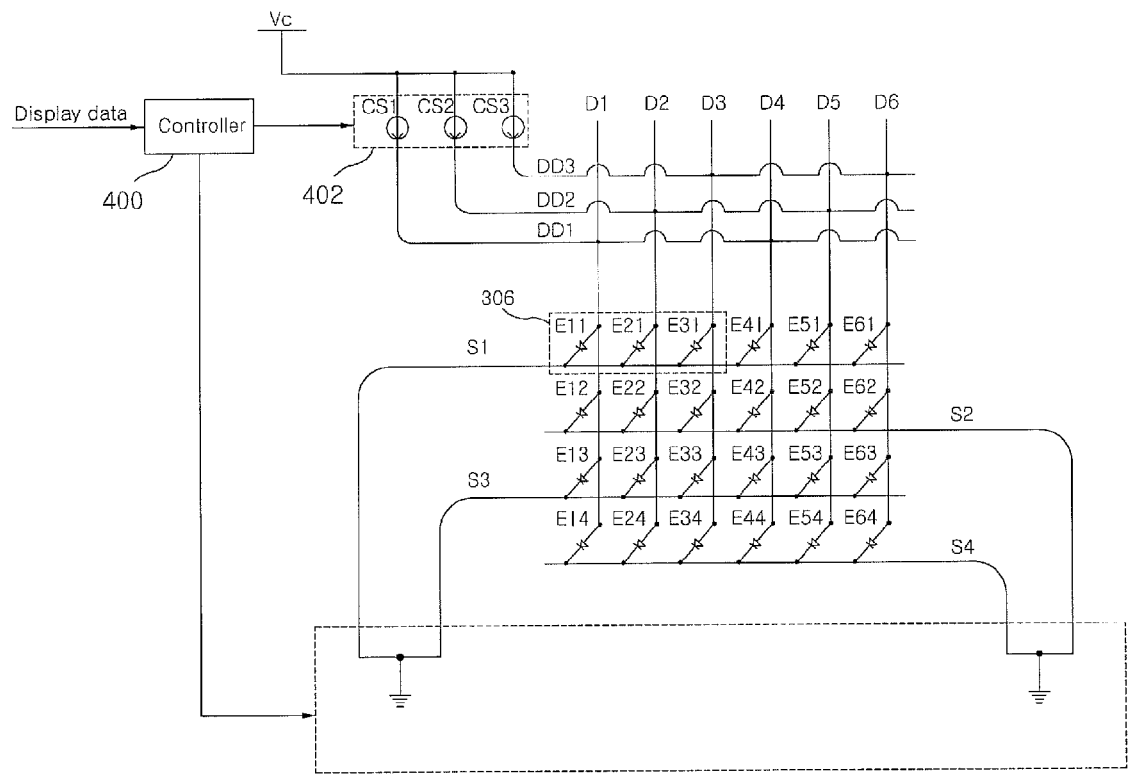
FIG. 4B is a circuit view illustrating the driving process according to another embodiment of the light emitting device of FIG. 3.

FIG. 4B is a circuit view illustrating the driving process according to another embodiment of the light emitting device of FIG. 3.

In FIG. 4B, the data driver 402 applies the data currents generated from the current sources CS1 to CS3 to the pixels E11 to E64 through the sub-electrode lines DD1 to DD3 and the data lines D1 to D6. In this case, all the pixels E11 to E64 can emit a light because the scan lines S1 to S4 are connected to the ground, differently from the scan lines S1 to S4 of FIG. 4A.

Figure 5A:
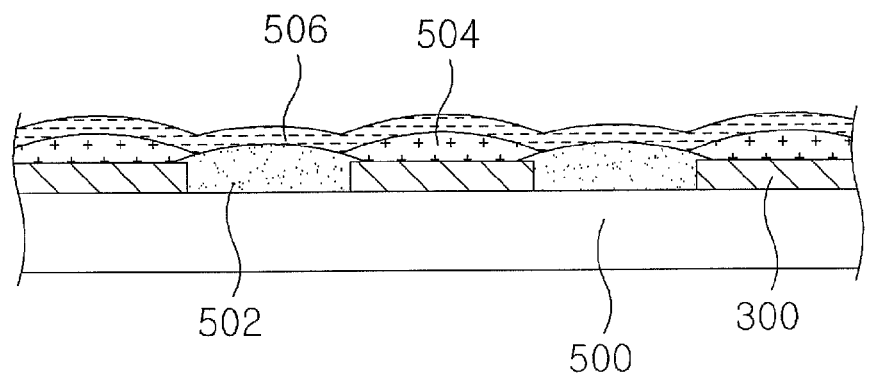
FIG. 5A is a sectional view of the light emitting device taken along line I-I' of FIG. 3.

FIG. 5A is a sectional view of the light emitting device taken along line I-I' of FIG. 3.

In FIG. 5A, the anode electrode layers 300 are formed on a substrate 500 with a predetermined pattern, and organic layers 504 are formed on the anode electrode layers 300.

Also, insulation layers 502 are formed between the anode electrode layers 300, whereby the anode electrode layers 300 are electrically divided.

A metal layer 506 is formed on the organic layers 504 and the insulation layers 502. Here, a part of the metal layer 506 corresponding to the anode electrode layers 300 and the organic layers 504 is the cathode electrode layers 302.

Figure 5B:
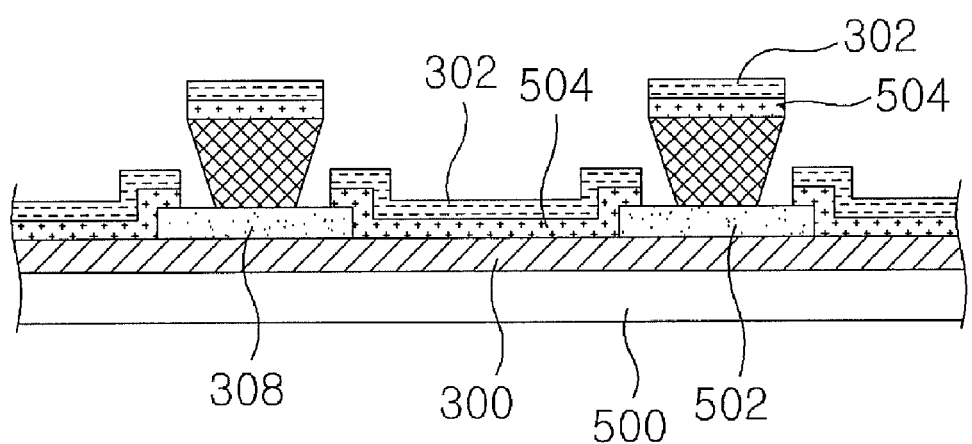
FIG. 5B is a sectional view of the light emitting device taken along line II-II' of FIG. 3.

FIG. 5B is a sectional view of the light emitting device taken along line II-II' of FIG. 3;

In FIG. 5B, the anode electrode layer 300, the organic layer 504 and the cathode electrode layer 302 are formed on the substrate 500 in sequence. Here, the organic layer 504 may emit a light having certain wavelength when a positive voltage is applied to the anode electrode layer 300, and a negative voltage is applied to the cathode electrode layer 302.

The first walls 308 are formed on the insulation layer 502 and electrically divide the cathode electrode layers 302.

Figure 5C:
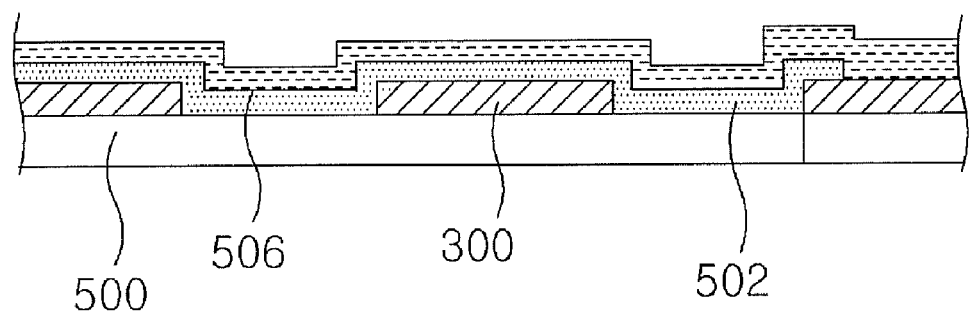
FIG. 5C is a sectional view of the light emitting device taken along line III-III' of FIG. 3.

FIG. 5C is a sectional view of the light emitting device taken along line III-III' of FIG. 3.

In, FIG. 5C, the insulation layer 502 is formed between the anode electrode layers 300, and the metal layer 506 is formed on the insulation layer 502. Here, a part of the metal layer 506, which corresponds to the anode electrode layers 300 and on which the insulation layer 502 is not formed, is the sub-electrode layer 310. That is, the contact part 314 consists of the anode electrode layer 300 and the metal layer 506 formed on the substrate 500 in sequence, specifically the sub-electrode layer 310, and functions as electric connecting part.

The light emitting device explained above is a bottom-type device in which the light emitted from the organic layer 504 is transmitted to outside through the substrate 500.

The light emitting device according to another embodiment of the present invention may be top-type device in which the light emitted from the organic layer is not transmitted to outside through a substrate, but transmitted to the cathode electrode layer. Accordingly, the cathode electrode layer may be made of a transparent material, e.g., thin metal. The anode electrode layer may be made of a reflective material to reflect the light.

Figure 6A:
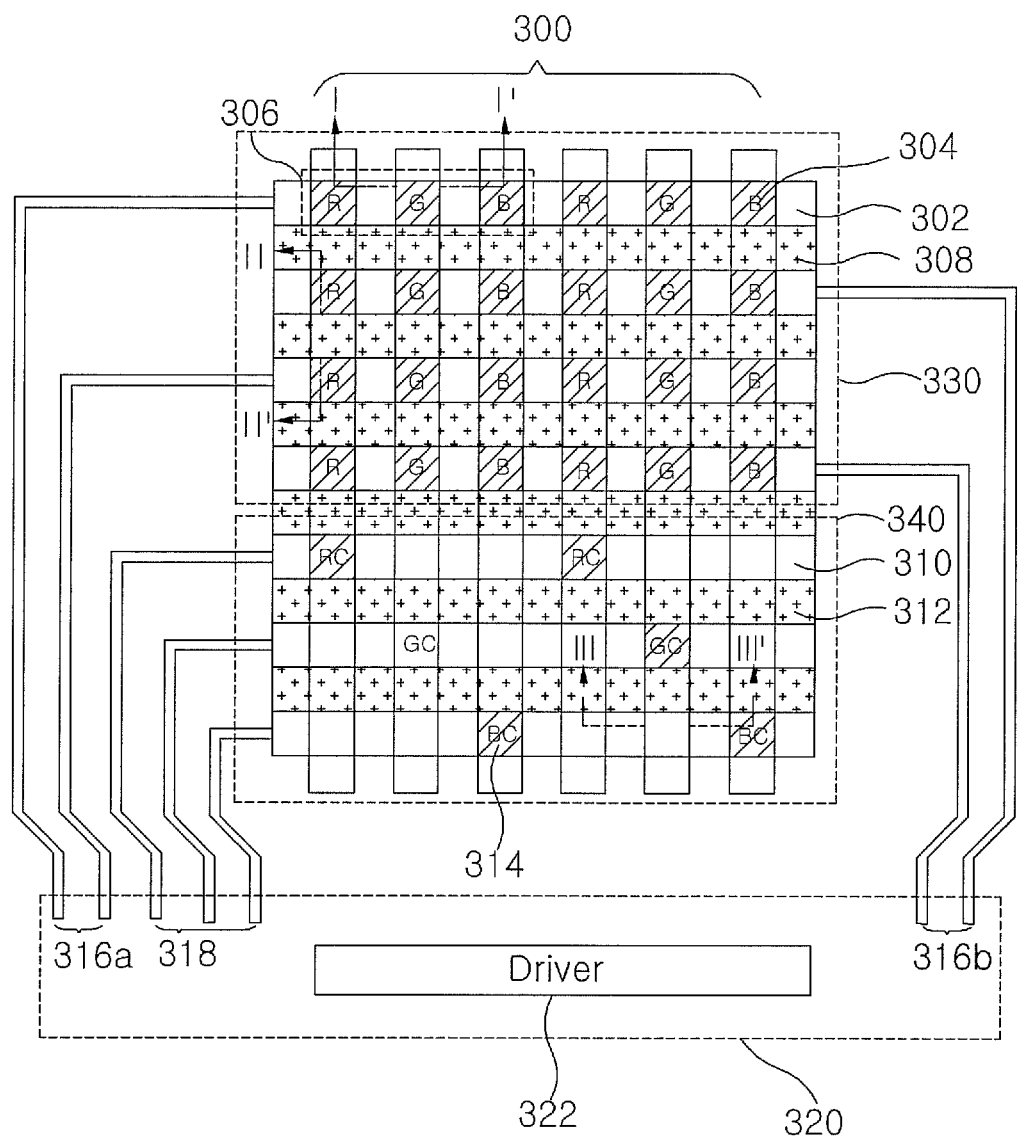
FIGS. 6A and 6B are plane views illustrating the light emitting device according to another embodiment of the present invention.
Figure 6B:
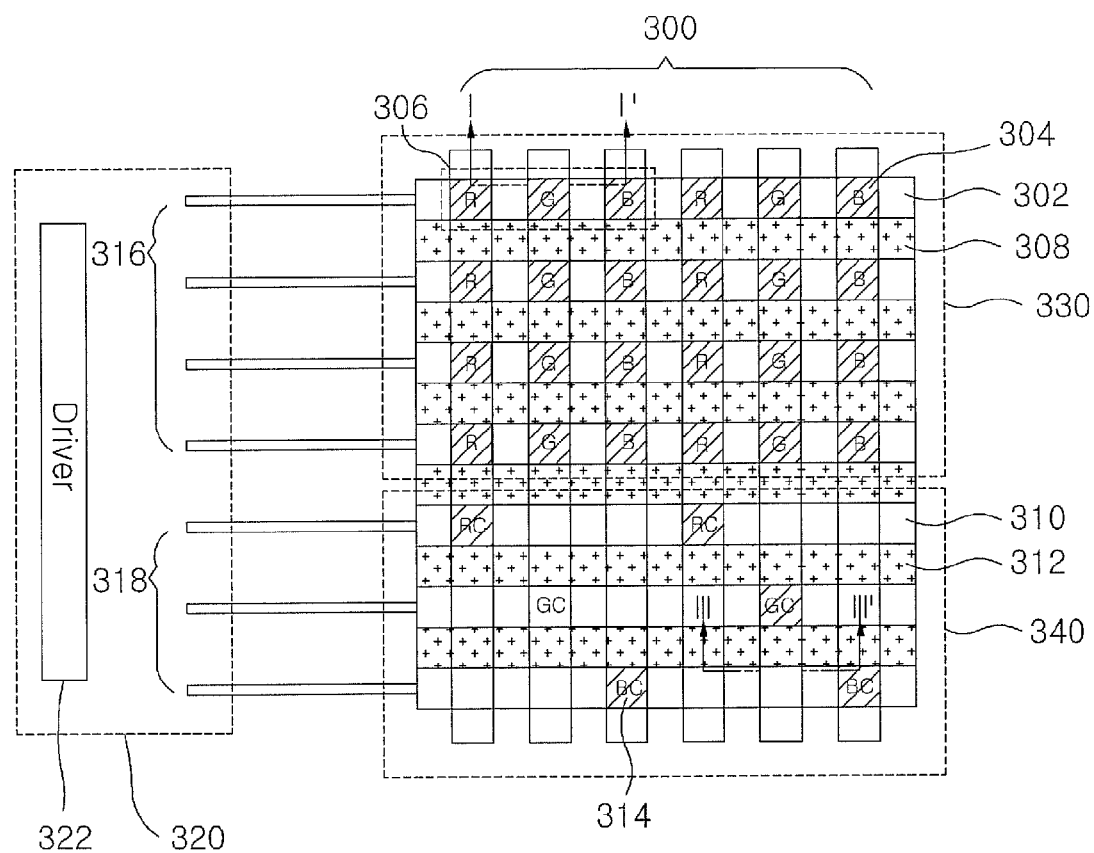

FIGS. 6A and 6B are plane views illustrating the light emitting device according to another embodiment of the present invention.

In the light emitting device of the present invention, the sub-electrode lines 318 may be arranged in one direction, as shown in FIG. 6A.

Also, the cathode lines 316 and the sub-electrode lines 318 may be arranged in one direction, as shown in FIG. 6B. In this case, the driver 322 may include a data driver and a scan driver.

The data driver provides data currents outputted from current sources to data lines through the sub-electrode layers 318.

The scan driver provides scan signals to the cathode lines 316. As a result, the cathode lines 316 are connected to emitting source, for example the ground, in sequence.

As explained above, the cathode lines 316 and the sub-electrode lines 318 can be arranged in various ways, and are not limited to those described above.

The other constitution is the same as the light emitting device described above, and so further description thereon are omitted below.

FIGS. 7A to 7D are cross-sectional views illustrating the process of manufacturing the light emitting device according to one embodiment of the present invention.

Figure 7A:
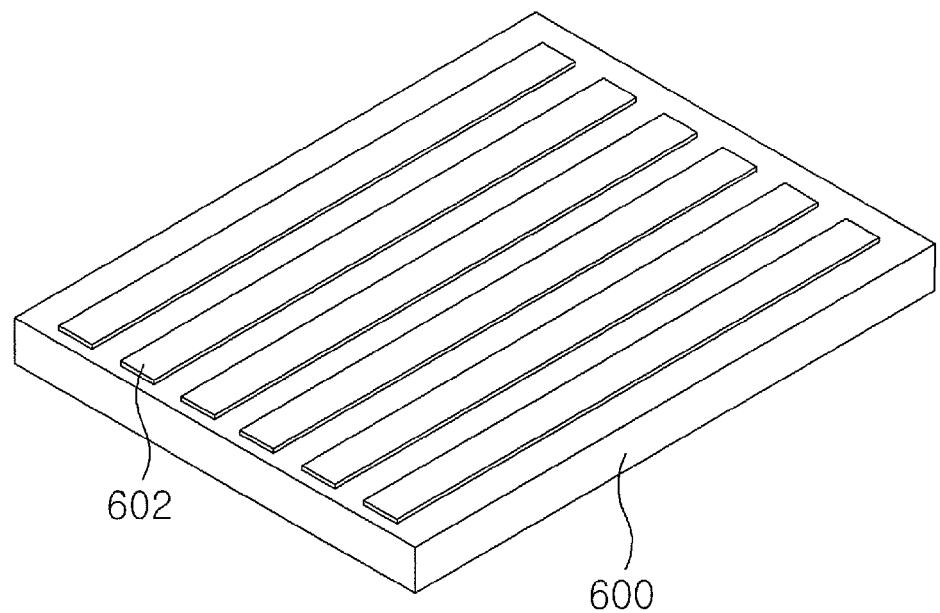
FIGS. 7A to 7D are cross-sectional views illustrating a process of manufacturing the light emitting device according to one embodiment of the present invention.

In FIG. 7A, first, anode electrode layers 602 are patterned on a substrate 600.

Figure 7B:
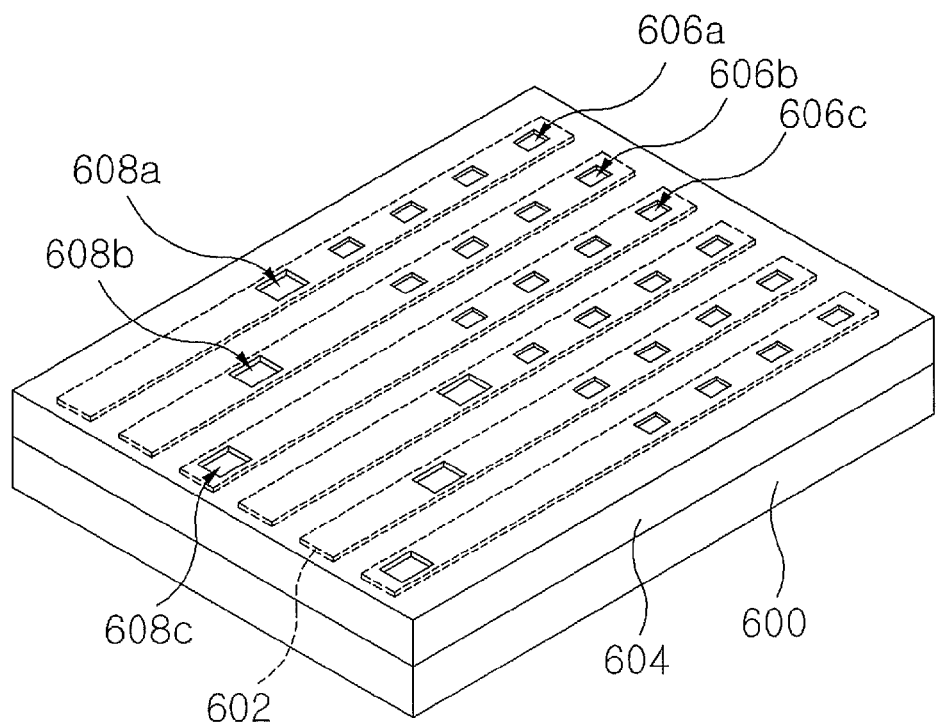

And, as shown in FIG. 7B, an insulation material 604 is deposited on the entire area of the substrate 600 on which the anode electrode layers 602 are formed.

Next, the insulation materials 604 corresponding to emitting areas 606a to 606c among the upper part of the anode electrode layers 602 and corresponding to the contact parts 608a to 608c among the non-emitting areas are removed as shown in FIG. 7B. That is, the emitting areas 606a to 606c and the contact parts 608a to 608c are exposed outside of the anode electrode layers 602.

Here, it is preferable that the insulation material 604 is removed to form the contact parts 608a to 608c larger than the emitting areas 606a to 606c.

Figure 7C:
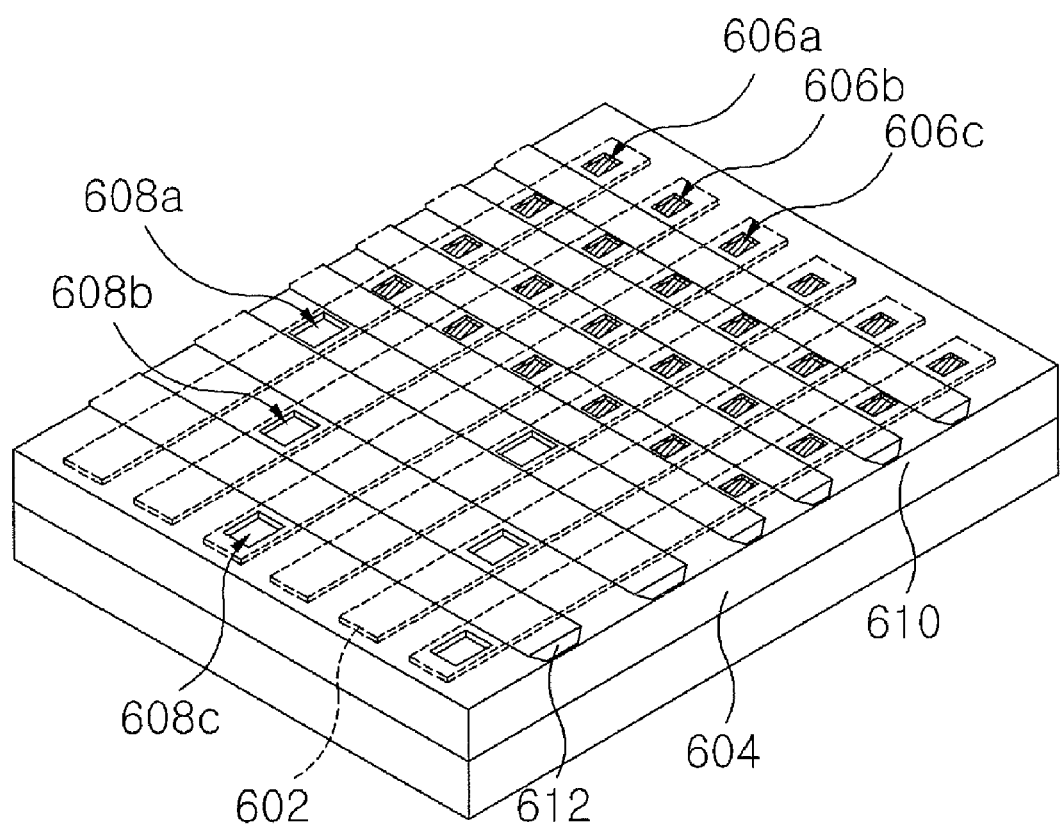

Next, as shown in FIG. 7C, first walls 610 are formed between the emitting areas 606a to 606c, and second walls 612 are formed between the contact parts 608a to 608c. The first walls 610 and the second walls 612 can be formed in different processes, but it is preferable to form them together in a same process. It can be decreased resistance because contact area between the sub-electrode layer 616 and the anode electrode layer 602 is increased.

Also, the width of the first wall 610 may be wider than that of the second wall 612.

And, organic materials are deposited on the anode electrode layers 602 on the emitting areas 606a to 606c, as shown in FIG. 7C. A red organic material corresponding to the red color light is deposited on the first emitting area 606a, a green organic material corresponding to the green color light is deposited on the second emitting area 606b, and a blue organic material corresponding to the blue color light is deposited on the third emitting area 606c. But, the organic material is not deposited on the contact parts 608a to 608c.

Figure 7D:
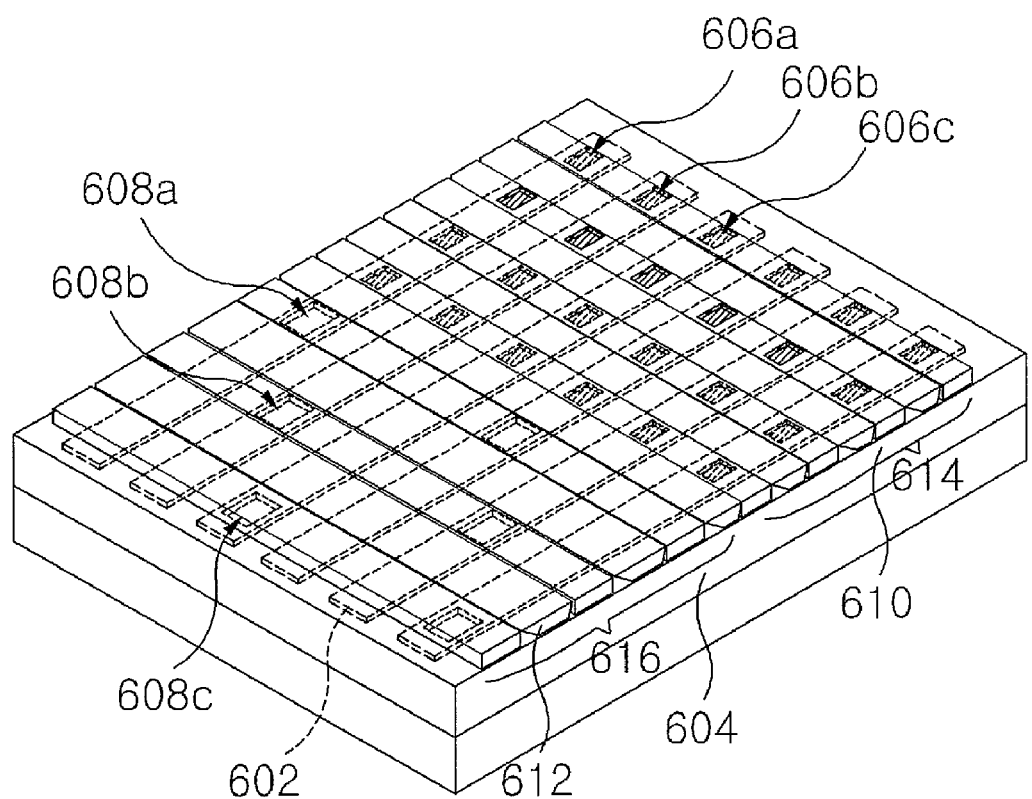

Next, as shown in FIG. 7D, a metal layer is deposited on the entire area of the substrate 600 on which the organic material is deposited. As a result, the metal layer is formed on the emitting areas 606a to 606c in the organic material to form the cathode electrode layers 614, and is formed on the anode electrode layers 602 in the contact parts 608a to 608c, thereby forming the sub-electrode layers 616.

In the depositing process, the organic material and the metal layer may be formed on the walls 610 and 612, though not illustrated above.

Above, in one sub-electrode line, one contact part is formed among a first contact part electrically connected to the red sub-pixel, a second contact part electrically connected to the green sub-pixel, and a third contact part electrically connected to the blue sub-pixel.

But, in another embodiment of the present invention, the contact part can be formed separately by data lines, not by emitting colors, in one sub-electrode line.

For example, in FIGS. 3 and 4A again, the first and third data lines D1 and D3 may be connected to the first sub-electrode line DD1, the second and sixth data lines D2 and D6 may be connected to the second sub-electrode line DD2, and the fourth and the fifth data lines D4 and D5 may be connected to the third sub-electrode line DD3. Also, combination of the sub-electrode lines DD1 to DD3 and the data lines D1 to D6 can be changed in various ways according to objectives of designers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present intention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A light emitting device comprising:
    a substrate having an emitting part and a non-emitting part, the emitting part including an emitting area;
    an anode electrode layer disposed on the substrate in a first direction;
    a cathode electrode layer disposed only on the emitting part of the substrate in a second direction different from the first direction;
    a pixel formed on the emitting area which is an area crossed by the anode electrode layer and the cathode electrode layer; and
    a sub-electrode layer disposed only on the non-emitting part and electrically connected with at least two anode electrode layers.

2. The light emitting device of claim 1, further comprising:
    an insulation layer disposed between the anode electrode layer and the sub-electrode layer.

3. The light emitting device of claim 2, wherein the insulation layer includes a contact part electrically connecting the anode electrode layer with the sub-electrode layer.

4. The light emitting device of claim 3, wherein the pixel comprises a first sub-pixel emitting a first color, a second sub-pixel emitting a second color, and a third sub-pixel emitting a third color, wherein the contact part comprises a first contact part formed from removing a part of the insulation layer on the anode electrode layer corresponding to the first sub-pixel, a second contact part formed from removing a part of the insulation layer on the anode electrode layer corresponding to the second sub-pixel, a third contact part formed from removing a part of the insulation layer on the anode electrode layer corresponding to the third sub-pixel.

5. The light emitting device of claim 4, wherein the sub-electrode layers are electrically connected to the first sub-pixel through the first contact part, the second sub-pixel through the second contact part, and the third sub-pixel through the third contact part.

6. The light emitting device of claim 5, further comprising:
    a driver applying a first data current to the first sub-pixel through the first contact part, a second data current to the second sub-pixel through the second contact part, and a third data current to the third sub-pixel through the third contact part.

7. The light emitting device of claim 1, further comprising:
    a first wall dividing the cathode electrode layers; and
    a second wall dividing the sub-electrode layers.

8. The light emitting device of claim 7, wherein a width of the first wall is different from a width of the second wall.

9. The light emitting device of claim 8, wherein the width of the second wall is wider than that of the first wall.

10. The light emitting device of claim 1, wherein the wherein a width of the sub-electrode layer is different from a width of the cathode electrode layer.

11. The light emitting device of claim 10, wherein the width of the sub-electrode layer is substantially same as, or wider than, that of the cathode electrode layer.

12. A light emitting device comprising:
    a substrate having an emitting part and a non-emitting part, the emitting part including emitting areas;
    anode electrode layers disposed on the substrate in a first direction;

cathode electrode layers disposed only on the emitting part of the substrate in a second direction different from the first direction;

a plurality of pixels on the emitting areas which are areas crossed by the anode electrode layers and the cathode electrode layers;

sub-electrode layers disposed only on the non-emitting part in the second direction; and at least one contact part formed on the anode electrode layers at positions which the anode electrode layers and the sub-electrode layers are crossed, wherein the contact part is electrically connected to the pixels.

13. The light emitting device of claim 12, wherein the pixel comprises a first sub-pixel emitting a first color, a second sub-pixel emitting a second color, and a third sub-pixel emitting a third color, wherein the contact part comprises a first contact part electrically connected to the first sub-pixel, a second contact part electrically connected to the second sub-pixel, a third contact part electrically connected to the third sub-pixel.

14. The light emitting device of claim 12, further comprising:

a controller receiving a display data; and a data driver applying data currents corresponding to the display data, to the sub-electrode layers, under control of the controller.

15. The light emitting device of claim 14, wherein the sub-electrode layers are connected to the data driver in one direction.

16. The light emitting device of claim 14, wherein one end of the sub-electrode layer is connected with the data driver in a part of the sub-electrode layers, and the other end of the sub-electrode layer is connected with the data driver in the other part of the sub-electrode layers.

17. The light emitting device of claim 12, wherein the light emitting device is an organic electroluminescent device.

18. The light emitting device of claim 12, wherein the light emitting device is used in an illuminating apparatus, a backlight apparatus, or a neon sign.

* * * * *

(12) EX PARTE REEXAMINATION CERTIFICATE (10253rd)
United States Patent
Kim et al.

(10) Number: US 7,737,443 C1
(45) Certificate Issued: Aug. 11, 2014

(54) LIGHT EMITTING DEVICE AND METHOD OF MANUFACTURING THE SAME

(75) Inventors: Hak Su Kim, Seoul (KR); Hyoung Yun Oh, Seoul (KR); Yoon Heung Tak, Gumi (KR)

(73) Assignee: LG Display Co., Ltd., Youngdungpo-Gu, Seoul (KR)

Reexamination Request:
No. 90/020,042, Nov. 19, 2013

Reexamination Certificate for:
Patent No.: 7,737,443
Issued: Jun. 15, 2010
Appl. No.: 11/755,462
Filed: May 30, 2007

(30) Foreign Application Priority Data

Jun. 2, 2006 (KR) .................. 10-2006-0049968

(51) Int. Cl.
*H01L 29/04* (2006.01)
*H01L 27/15* (2006.01)

(52) U.S. Cl.
USPC .............................................. 257/59; 257/72

(58) Field of Classification Search
None
See application file for complete search history.

(56) References Cited

To view the complete listing of prior art documents cited during the proceeding for Reexamination Control Number 90/020,042, please refer to the USPTO's public Patent Application Information Retrieval (PAIR) system under the Display References tab.

*Primary Examiner* — Hetul Patel

(57) ABSTRACT

A light emitting device comprises an anode electrode layer disposed in a first direction, a cathode electrode layer disposed in a second direction different from the first direction, an emitting area with a pixel forming on an area crossed by the anode electrode layer and the cathode electrode layer and a sub-electrode layer disposed outside of the emitting area and electrically connected with at least two the anode electrode layers.

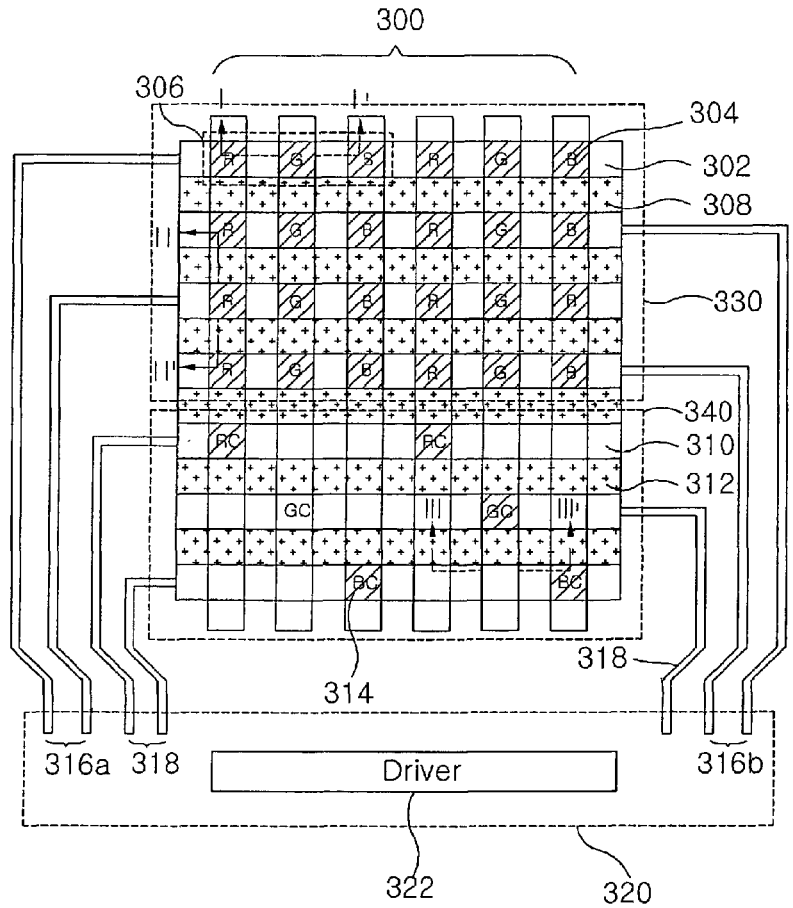

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 2 is cancelled.

Claims 1, 3, 7-12 and 16 are determined to be patentable as amended.

Claims 4-6, 13-15 and 17-18, dependent on an amended claim, are determined to be patentable.

New claims 19-28 are added and determined to be patentable.

1. A light emitting device comprising:
a substrate having an emitting part and a non-emitting part, the emitting part including an emitting area;
[an] anode electrode [layer] *layers* disposed on *the emitting part and the non-emitting part of* the substrate in a first direction;
[a] cathode electrode [layer] *layers* disposed only on the emitting part of the substrate in a second direction different from the first direction;
a pixel formed on the emitting area which is an area crossed by *one of* the anode electrode [layer] *layers* and *one of* the cathode electrode [layer] *layers*; [and
a] sub-electrode [layer] *layers* disposed only on the non-emitting part *to cross the anode electrode layers in the non-emitting part* and *each* electrically connected with at least two *of the* anode electrode layers; *and*
*an insulation layer disposed between the anode electrode layers and the sub-electrode layers where the anode electrode layers and the sub-electrode layers cross.*

3. The light emitting device of claim [2] *1*, wherein [the insulation layer includes a contact part electrically connecting] *one of* the anode electrode [layer] *layers is electrically connected* with *one of* the sub-electrode [layer] *layers through a contact part formed from removing a part of the insulation layer*.

7. The light emitting device of claim 1, further comprising:
[a first wall dividing the cathode electrode layers; and
a second wall dividing the sub-electrode layers]
*first walls formed on the insulation layer and disposed between the cathode electrode layers to electrically divide each of the cathode electrode layers; and*
*second walls formed on the insulation layer and disposed between the sub-electrode layers to electrically divide each of the sub-electrode layers,*
*wherein each of the first and second walls has a structure tapered outwardly in an upward direction from the substrate, the upward direction being orthogonal to the first and second directions, and the first and second walls extend substantially parallel to each other in the second direction.*

8. The light emitting device of claim 7, wherein a width of *one of* the first [wall] *walls* is different from a width of *one of* the second [wall] *walls*.

9. The light emitting device of claim 8, wherein the width of *one of* the second [wall] *walls* is wider than that of *one of* the first [wall] *walls*.

10. The light emitting device of claim 1, [wherein the] *wherein a* width of *one of* the sub-electrode [layer] *layers* is different from a width of *one of* the cathode electrode [layer] *layers*.

11. The light emitting device of claim 10, wherein the width of *one of* the sub-electrode [layer] *layers* is [substantially same as, or] wider than[,] that of *one of* the cathode electrode [layer] *layers*.

12. A light emitting device comprising:
a substrate having an emitting part and a non-emitting part, the emitting part including emitting areas;
anode electrode layers disposed on *the emitting part and the non-emitting part of* the substrate in a first direction;
cathode electrode layers disposed only on the emitting part of the substrate in a second direction different from the first direction;
a plurality of pixels on the emitting areas [which are areas], *each emitting area being an area* crossed by *one of* the anode electrode layers and *one of* the cathode electrode layers;
sub-electrode layers disposed only on the non-emitting part in the second direction *to cross the anode electrode layers in the non-emitting part*; [and]
at least one contact part formed on the anode electrode layers at positions which the anode electrode layers and the sub-electrode layers are crossed[,]; *and*
*an insulation layer disposed between the anode electrode layers and the sub-electrode layers where the anode electrode layers and the sub-electrode layers cross,*
wherein the contact part is electrically connected to the pixels.

16. The light emitting device of claim 14, wherein [one end of the sub-electrode layer is connected with] the data driver [in a part] *is connected to some* of the sub-electrode layers *at one end*, and [the other end of the sub-electrode layer is connected with] the data driver [in] *is connected to* the other [part of the] sub-electrode layers *at the other end*.

*19. The light emitting device of claim 3, wherein the contact part is larger than the emitting area.*

*20. The light emitting device of claim 12, wherein the contact part is larger than any one of the emitting areas.*

*21. The light emitting device of claim 1, further comprising:*
*organic light-emitting layers disposed between the anode electrode layers and the cathode electrode layers,*
*wherein the cathode electrode layers and the sub-electrode layers are formed of a same material.*

*22. The light emitting device of claim 12, further comprising:*
*organic light-emitting layers disposed between the anode electrode layers and the cathode electrode layers,*
*wherein the cathode electrode layers and the sub-electrode layers are formed of a same material.*

*23. The light emitting device of claim 1, wherein the anode electrode layers are disposed between the sub-electrode layers and the substrate, and the insulation layer is disposed between the sub-electrode layers and the anode electrode layers; and*
*wherein material of the insulation layer is removed to form contact parts electrically connecting the anode electrode layers with the sub-electrode layers.*

*24. The light emitting device of claim 23, wherein the cathode electrode layers are substantially parallel to the sub-* electrode layers, and wherein the second direction is substantially perpendicular to the first direction.

25. The light emitting device of claim 12, wherein the anode electrode layers are disposed between the sub-electrode layers and the substrate, and the insulation layer is disposed between the sub-electrode layers and the anode electrode layers; and wherein material of the insulation layer is removed to form the at least one contact part, the at least one contact part electrically connecting the anode electrode layers with the sub-electrode layers.

26. The light emitting device of claim 25, wherein the cathode electrode layers are substantially parallel to the sub-electrode layers, and wherein the second direction is substantially perpendicular to the first direction.

27. The light emitting device of claim 12, further comprising:

first walls formed on the insulation layer and disposed between the cathode electrode layers to electrically divide each of the cathode electrode layers; and second walls formed on the insulation layer and disposed between the sub-electrode layers to electrically divide each of the sub-electrode layers, wherein each of the first and second walls has a structure tapered outwardly in an upward direction from the substrate, the upward direction being orthogonal to the first and second directions, and the first and second walls extend substantially parallel to each other in the second direction.

28. The light emitting device of claim 7, wherein cathode electrode material is disposed on top of the first and second walls with organic light-emitting layer material disposed between the cathode electrode material and each of the first and second walls.

* * * * *